(12) United States Patent  
Kim et al.

(10) Patent No.: US 7,151,001 B2
(45) Date of Patent: Dec. 19, 2006

(54) FABRICATION METHOD OF SELF-ALIGNED FERROELECTRIC GATE TRANSISTOR USING BUFFER LAYER OF HIGH ETCHING SELECTIVITY

(75) Inventors: Yong-Tae Kim, Seoul (KR); Seong-Il Kim, Seoul (KR); Chun-Keun Kim, Seoul (KR); Sun-Il Shim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 10/922,949

(22) Filed: Aug. 23, 2004

(65) Prior Publication Data

US 2005/0142667 A1   Jun. 30, 2005

(30) Foreign Application Priority Data

Aug. 26, 2003  (KR)  .................... 10-2003-0059188

(51) Int. Cl.
 *H01L 21/00* (2006.01)
(52) U.S. Cl. .................... 438/3; 257/295; 257/306; 257/665; 257/E21.436; 257/E21.663
(58) Field of Classification Search ............ 438/3, 438/239; 257/295, E21.208, E21.436, E21.663, 257/306
See application file for complete search history.

(56) References Cited

U.S. PATENT DOCUMENTS

| 6,051,865 A * | 4/2000 | Gardner et al. ............. 257/411 |
| 6,124,620 A * | 9/2000 | Gardner et al. ............. 257/411 |
| 6,194,752 B1 * | 2/2001 | Ogasahara et al. ......... 257/295 |
| 6,608,339 B1 * | 8/2003 | Tarui et al. ................ 257/295 |

FOREIGN PATENT DOCUMENTS

JP         11026704 A  *  1/1999

* cited by examiner

*Primary Examiner*—B. William Baumeister
*Assistant Examiner*—Igwe U. Anya
(74) *Attorney, Agent, or Firm*—McDermott Will & Emery LLP

(57) ABSTRACT

A fabrication method of a self-aligned ferroelectric gate transistor using a buffer layer of high etching selectivity is disclosed. A stacked structure is formed with a buffer layer with high etching selectivity inserted between a silicon substrate and a ferroelectric layer, and etching is performed on a portion where a source and a drain will be formed and then stopped at the buffer layer, thereby fabricating a self-aligned ferroelectric gate transistor without damage to the silicon thin film, and thus, an integration degree of a chip can be improved.

7 Claims, 3 Drawing Sheets

FABRICATION METHOD OF SELF-ALIGNED FERROELECTRIC GATE TRANSISTOR USING BUFFER LAYER OF HIGH ETCHING SELECTIVITY

BACKGROUND OF THE INVENTION

1. Field of the Invention

The present invention relates to a fabrication method of a self-aligned ferroelectric gate transistor and, more particularly, to a fabrication method of a self-aligned ferroelectric gate transistor using a buffer layer of high etching selectivity to improve a chip density without damage to a silicon substrate.

2. Description of the Background Art

A conventional fabrication method of a ferroelectric gate transistor is as follows.

First, source and drain regions are formed in a silicon substrate, on which a thin film layer with high oxidizing power is formed, on which a ferroelectric layer and an electrode layer are formed sequentially, resulting in a stacked structure consisting of silicon/thin film layer/ferroelectric layer/electrode layer.

The reason for formation of the thin film layer with high oxidizing power on the silicon substrate is to prevent degradation of operational characteristics of the ferroelectric due to a $SiO_2$ thin film formed at the interface of the ferroelectric and silicon. In other words, during the process of fabrication of the self-aligned ferroelectric gate transistor, generally, the $SiO_2$ thin film is undesirably formed at the interface of the ferroelectric and silicon to degrade operational characteristics of the ferroelectric. Thus, by forming the thin film layer with high oxidizing power on the silicon substrate, formation of the $SiO_2$ thin film can be restrained because the thin film layer has a stronger bonding force with oxygen than silicon.

Next, with the resulting stacked structure, the electrode layer and the ferroelectric layer corresponding to the source and drain regions are wet-etched for metal wiring.

However, such a conventional fabrication method has the following problem.

That is, for example, due to the misalign in a photo process, a margin overlapped between the source/gate and drain/gate should be provided. Also, since the areas of the source and drain are enlarged due to the wet etching, integration degree of the ferroelectric gate transistor cannot be enhanced.

Thus, in order to enhance the integration degree, the self-alignment gate process currently adopted for the CMOS process needs to be applied to the ferroelectric gate transistor.

A dry etching is performed in the self-alignment gate process. However, when the ferroelectric layer and thin film layer are dry-etched, silicon is also etched due to a low etching selectivity, causing a problem that the surface of silicon is much damaged.

SUMMARY OF THE INVENTION

Therefore, an object of the present invention is to provide a method for fabricating a self-aligned ferroelectric gate transistor using a buffer layer of high etching selectivity capable of preventing damage of a silicon substrate and enhancing an integration degree of a self-aligned ferroelectric gate transistor by inserting a buffer layer with high etching selectivity between a silicon substrate and a ferroelectric layer and performing a dry etching.

To achieve these and other advantages and in accordance with the purpose of the present invention, as embodied and broadly described herein, there is provided a method for fabricating a self-aligned ferroelectric gate transistor including: forming a buffer layer made of a material with high etching selectivity on a silicon substrate; forming an ferroelectric layer and an upper electrode on the buffer layer; etching the ferroelectric layer and the upper electrode except for a portion corresponding to a gate; stopping etching at the buffer layer; and forming a source and a drain at the etched portion through ion implantation.

Another object of the present invention is to provide a self-aligned ferroelectric gate transistor fabricated by the above-described method.

Still another object of the present invention is to provide a ferroelectric memory with high integration by using the self-aligned ferroelectric gate transistor fabricated by the above-described fabrication method.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

The present invention will now be described in detail.

Figure 1A:
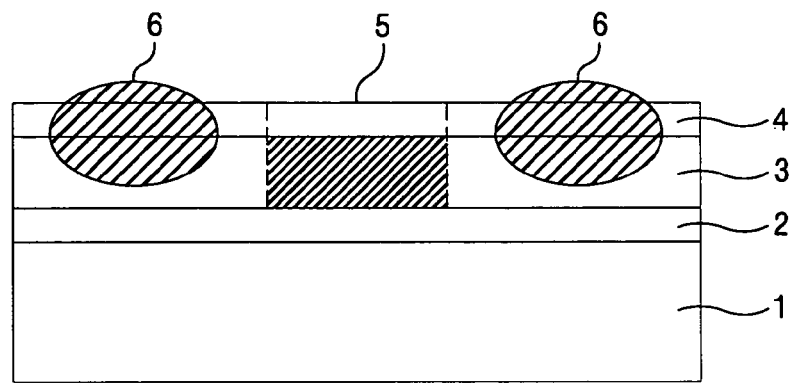
FIGS. 1A to 1C are sequential sectional views showing process of fabricating a self-aligned ferroelectric gate transistor in accordance with the present invention.
Figure 1B:
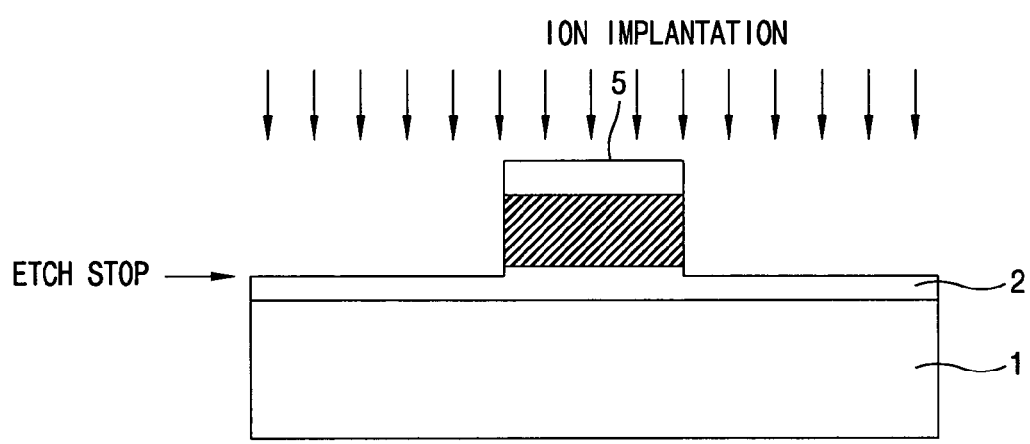
Figure 1C:
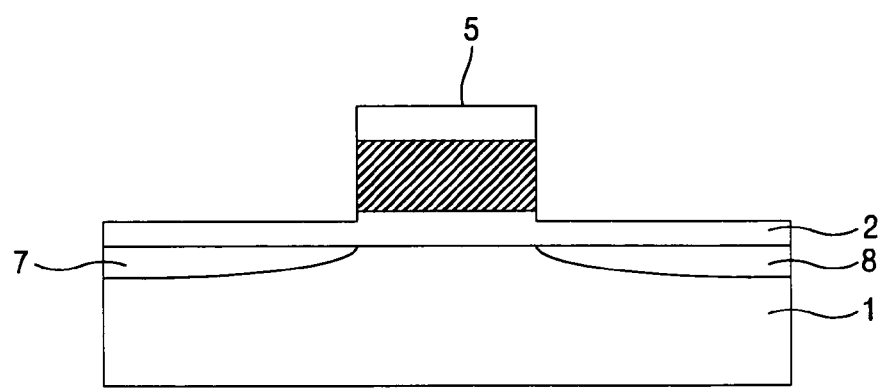

FIGS. 1A to 1C are sequential sectional views showing process of fabricating a self-aligned ferroelectric gate transistor in accordance with the present invention.

First, a buffer layer 2 made of a material with high etching selectivity is formed on a silicon substrate 1. The buffer layer 2 allows silicon at the portion where the source and drain will be formed not to be damaged when an upper electrode 4 and a ferroelectric layer 3 are etched. In the present invention, as a material with a high etching selectivity, $CeO_2$ or $Y_2O_3$ may be used.

Figure 2A:
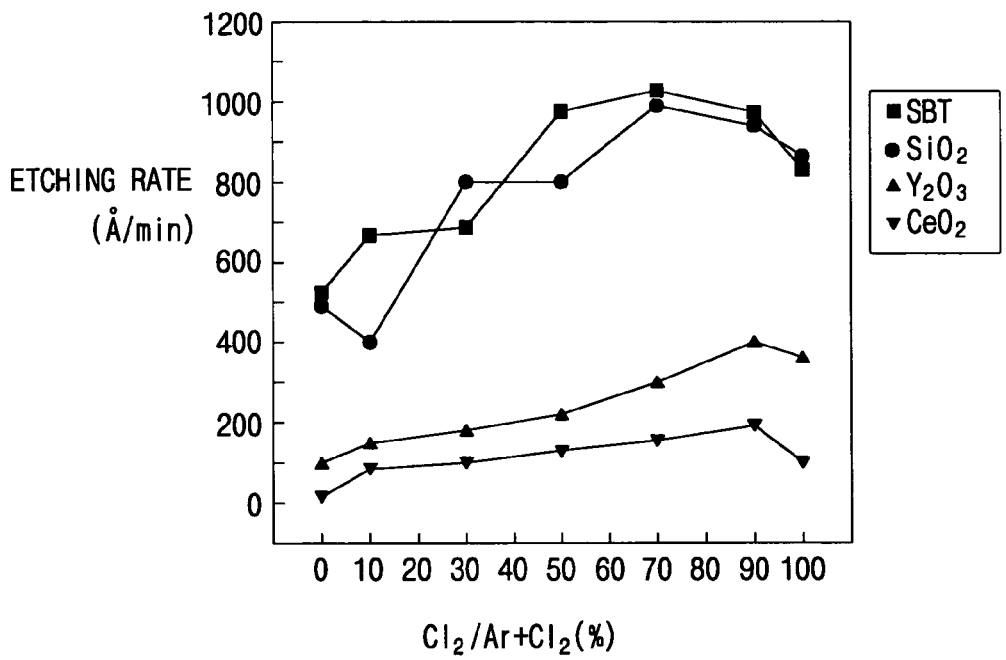
FIG. 2A is a graph showing etching rates of several materials.

FIG. 2A is a graph showing etching rates of SBT, $SiO_2$ and materials ($CeO_2$ or $Y_2O_3$) used as the buffer layer in a dry etching using $Cl_2/Ar+Cl_2$ gas. In FIG. 2A, it is noted that as the amount of $Cl_2$ increases, the etching rates of SBT thin film and $SiO_2$ thin film remarkably increase whereas etching rates of $CeO_2$ or $Y_2O_3$ increase very small.

Figure 2B:
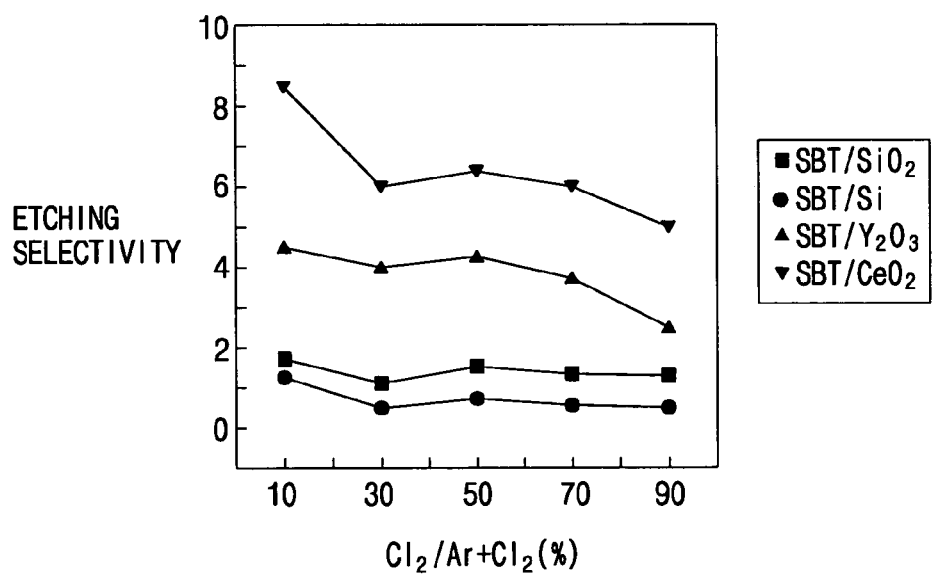
FIG. 2B is a graph showing an etching selectivity of several materials with respect to an STB.

FIG. 2B shows etching selectivity of $SiO_2$, Si, $CeO_2$ and $Y_2O_3$ to SBT in the etching using $Cl_2/Ar+Cl_2$ gas. In FIG. 2B, it is noted that since Si has a higher etching rate than STB (the etching selectivity is not greater than 1), ferroelectric layer cannot be etched without damage to the silicon substrate.

Also, since $SiO_2$ and SBT have the almost same etching rate, in order to etch the SBT layer of 300 nm, the thickness of the $SiO_2$ thin film should be about 99 nm in consideration that an error of the etching rate and an error of the thickness of the thin film are 10%, respectively, according to equation shown below:

$$d_{buffer}=(d_0/E_{v0})2(\alpha+\beta)E_{buffer}$$

wherein $d_0$ is the thickness of a thin film to be etched, $E_{v0}$ is a vertical etching rate of the thin film to be etched, $\alpha$ is an error of the thickness of the thin film, $\beta$ is an error of an etching rate, $d_{buffer}$ is the thickness of a buffer layer, and $E_{buffer}$ is a vertical etching rate of the buffer layer.

If $SiO_2$ is used as the buffer layer 2, as mentioned above, the thickness of the buffer layer would increase to raise an operation voltage. Also, if high electric field is applied, breakdown may occur. For this reason, $SiO_2$ is not suitable for the buffer layer.

If $CeO_2$ or $Y_2O_3$ is used as the buffer layer 2, the silicon substrate 1 can be prevented from being etched only with the thickness of 18 nm in case of $CeO_2$; 30 nm in case of $Y_2O_3$. In addition, $CeO_2$ and $Y_2O_3$ have strong oxidizing power so that they can also serve as a conventional thin film layer.

Accordingly, the buffer layer with the high etching selectivity not only prevents damage of the silicon substrate but also improves characteristics of the ferroelectric by restraining generation of the $SiO_2$ thin film.

In the present invention, the etching selectivity of the ferroelectric layer 3 and the buffer layer 2 are not smaller than 4.

After the buffer layer 2 made of a material as mentioned above, a ferroelectric layer 3 and an upper electrode 4 are sequentially formed on the buffer layer 2, forming a stacked structure as shown in FIG. 1A.

In the stacked structure, etching is performed only on the shaded portion 6, leaving a portion 5 corresponding to the gate as it is.

When the buffer layer 2 is exposed as the shaded portion 6 is etched, etching is stopped. FIG. 1B shows the section of the stacked structure as formed after etching is stopped. Herein, it is noted that the buffer layer 2 is etched up to the etch stop line.

Figure 3A:
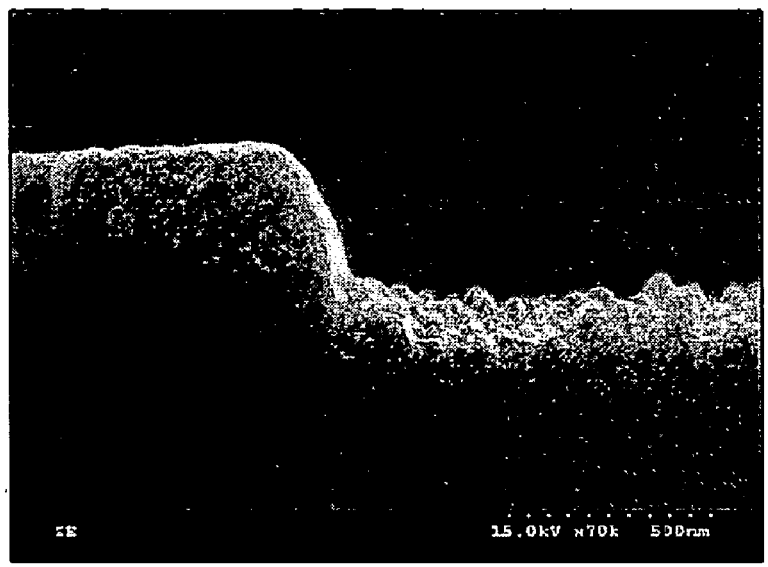
FIG. 3A is a photo of an etching result in case that there is no buffer layer taken by a scanning microscope.
Figure 3B:
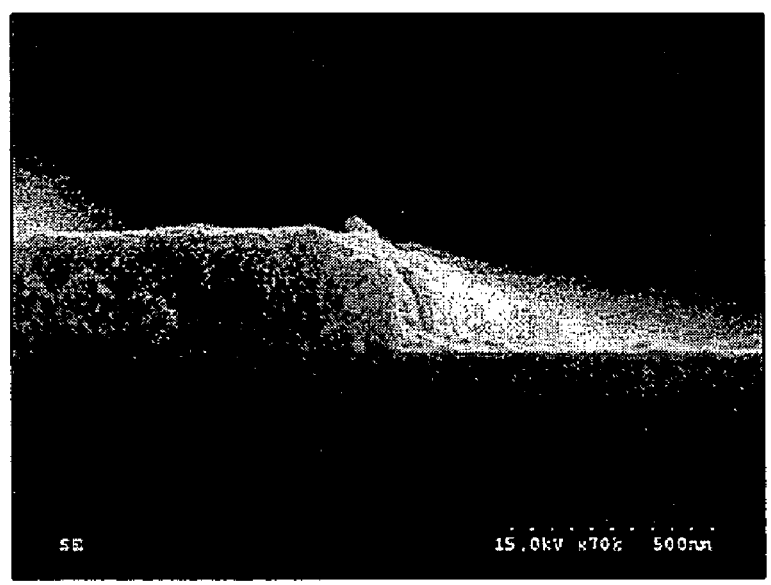
FIG. 3B is a photo of an etching result in case that there is a buffer layer taken by a scanning microscope.

FIGS. 3A and 3B are photos showing the results of actual etching taken by a scan microscope.

In FIGS. 3A and 3B, overetching was performed extending time, assuming that there is no error in the thickness of a thin film and an etching rate. FIG. 3A shows a resulting state that 20% overetching was performed without a buffer layer, and FIG. 3B shows a resulting state that 20% overetching was performed by using $CeO_2$ buffer layer of 18 nm.

As shown in FIGS. 3A and 3B, it is noted that the surface of silicon is severely damaged in case of non-existence of the buffer layer while existence of the buffer layer allows the surface of silicon not to be damaged because etching is stopped on the buffer layer.

And then, an ion implantation is performed on the etched stacked structure. Then, ion is not implanted on the portion 5 corresponding to the gate but only on the etched portion.

When a source 7 and a drain 8 are formed on the silicon substrate 1, a self-aligned ferroelectric gate transistor as shown in FIG. 1C is completed.

With reference to FIG. 1C, the gate of the self-aligned ferroelectric gate transistor fabricated by the fabrication method of the present invention consists of the silicon layer, the buffer layer made of the material with high etching selectivity formed on the silicon layer, the ferroelectric layer formed on the buffer layer, and the upper electrode formed on the ferroelectric layer.

In addition, the self-aligned ferroelectric gate transistor fabricated by the fabrication method of the present invention can be applied to 1-transistor type or different type ferroelectric memory to fabricate a ferroelectric memory with improved operational characteristics.

As so far described, the fabrication method of a self-aligned ferroelectric gate transistor using a buffer layer of high etching selectivity in accordance with the present invention has the following advantages.

That is, since the buffer layer made of a material with high etching selectivity is inserted between silicon and the ferroelectric and etching is stopped at the buffer layer, the integration degree of the self-aligned ferroelectric gate transistor can be improved without damage to the silicon thin film.

In addition, since the material with a high etching selectivity used in the present invention has strong oxidizing power, it can also serve as the conventional thin film layer restraining $SiO_2$ generated on the interface of the silicon and the ferroelectric. Thus, the operational characteristics of the self-aligned ferroelectric gate transistor can be improved.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A method for fabricating a self-aligned ferroelectric gate transistor comprising:
    forming a buffer layer made of one of $CeO_2$ or $Y_2O_3$ as an etch-stop layer as well as a gate insulation layer on a silicon substrate;
    forming a ferroelectric layer and an upper electrode sequentially on the buffer layer;
    etching the ferroelectric layer and the upper electrode except for a portion corresponding to a gate;
    stopping etching at the buffer layer; and
    forming a source and a drain at the etched portion through ion implantation.

2. The method of claim 1, wherein the etching selectivity of the ferroelectric layer and the buffer layer is not smaller than 4.

3. A self-aligned ferroelectric gate transistor fabricated by the method of claim 1.

4. A ferroelectric memory comprising the self-aligned ferroelectric gate transistor of claim 3.

5. The method of claim 1, wherein the etching is performed using $Cl_2/Ar+Cl_2$ as an etching gas.

6. A self-aligned ferroelectric gate transistor having a gate structure formed by performing an etching on a portion where a source and a drain will be formed and stopping theetching at a buffer layer in a stacked structure including a silicon layer, a buffer layer made of a material with high etching selectivity formed on the silicon layer, a ferroelectric layer formed on the buffer layer and an upper electrode formed on the ferroelectric layer, wherein the etching selectivity of the ferroelectric layer and the buffer layer is not smaller than 4.

7. The self-aligned ferroelectric gate transistor of claim 6, wherein the buffer layer is made of one of $CeO_2$ or $Y_2O_3$.

* * * * *